United States Patent [19]

Kawa et al.

[11] 4,286,379
[45] Sep. 1, 1981

[54] APPARATUS FOR DETECTING LEADS

[75] Inventors: Hidetoshi Kawa, Ibaraki; Kazuhiro Mori, Katano; Kazuo Watanabe, Hirakata; Yoshihiko Misawa, Katano, all of Japan

[73] Assignee: Matsushita Electric Industrial Co., Ltd., Osaka, Japan

[21] Appl. No.: 76,431

[22] Filed: Sep. 17, 1979

[30] Foreign Application Priority Data

Sep. 20, 1978 [JP] Japan .............................. 53-116434

[51] Int. Cl.³ .............................................. H05K 3/32
[52] U.S. Cl. ............................................ 29/705; 29/741
[58] Field of Search ...................... 29/705, 741, 566.3

[56] References Cited

U.S. PATENT DOCUMENTS

| 2,867,810 | 1/1959 | Gagnon. | |
|---|---|---|---|
| 2,896,213 | 7/1959 | Alderman | 29/566.3 |
| 3,392,256 | 7/1968 | Bradham | 29/741 X |
| 3,429,170 | 2/1969 | Romeo | 29/566.3 X |
| 3,611,544 | 10/1971 | Frels et al. | 29/741 X |
| 3,729,799 | 5/1973 | Eberle | 29/705 |
| 3,882,597 | 5/1975 | Chayka et al. | 29/705 X |
| 4,110,880 | 9/1978 | Peppler et al. | 29/705 X |
| 4,218,817 | 8/1980 | Takano | 29/741 |

Primary Examiner—Jimmy C. Peters
Attorney, Agent, or Firm—Joseph W. Farley

[57] ABSTRACT

An apparatus for detecting whether or not the leads of electronic components such as dual in-line package type IC components have been properly inserted into printed circuit boards and also for properly clinching the projecting portions of the leads to the rear side of the boards. The apparatus comprises a pair of openable or closable lever main bodies, levers pivotably supported on the lever main bodies by pins disposed at right angles with the opening or closing direction to come into contact with the leads to be detected, elastic members for delivering a lever main body closing force to the levers, and photoelectric means mounted on the lever main bodies for detecting the movement of the levers relative to the lever main bodies.

6 Claims, 16 Drawing Figures

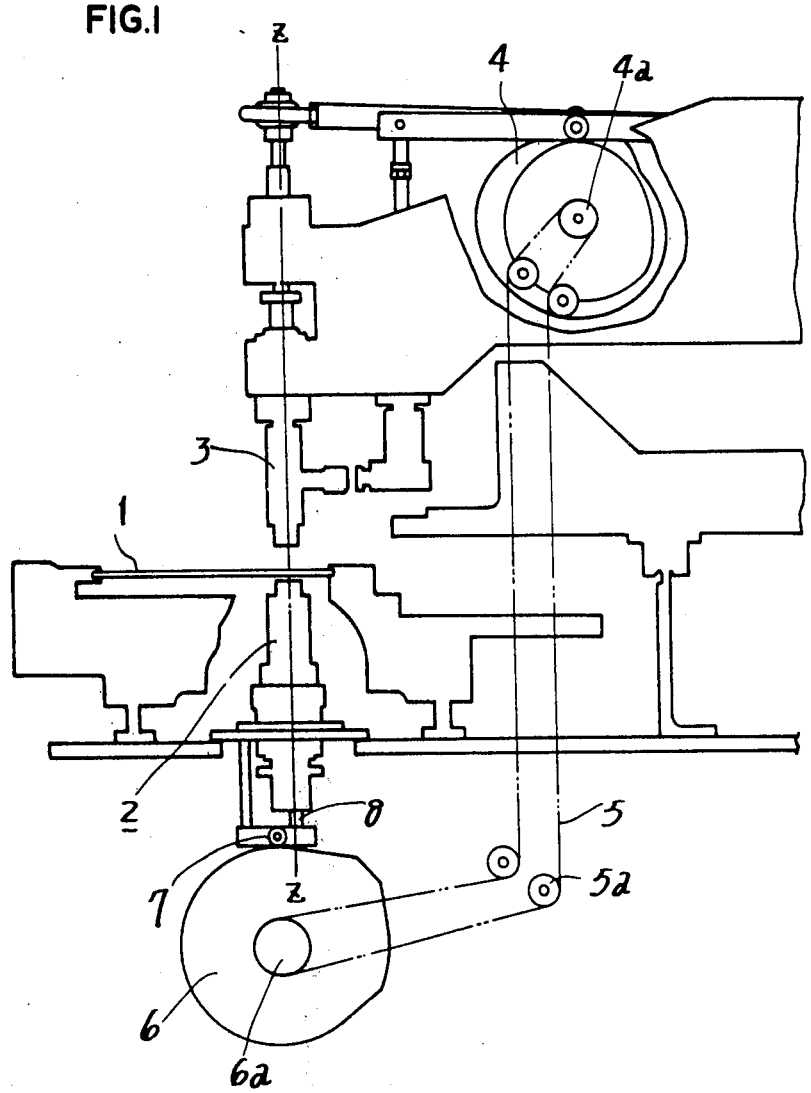

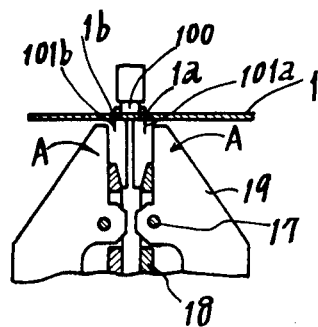
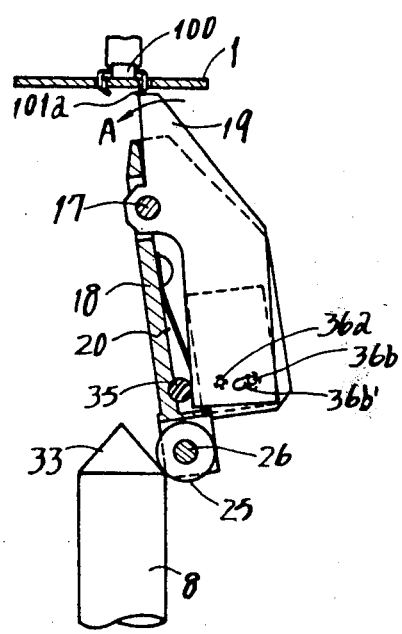
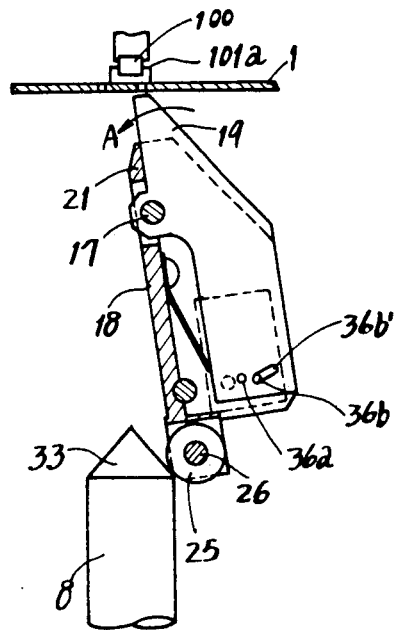

APPARATUS FOR DETECTING LEADS

The present invention relates to an apparatus for detecting whether or not the leads of dual in-line package type IC components and like electronic components (hereinafter referred to briefly as "components") have been properly inserted into printed circuit boards and also for properly clinching the projecting portions of the leads to the rear side of the boards.

With reference to FIGS. 7a to 10, a conventional apparatus of this type will be described. FIGS. 7a and 7b show a resistor main body 200 having two leads 201a and 201b. When the leads have been passed through holes 203a and 203b in a printed board 202 and inserted into cutting bores 206 formed in stationary cutting members 205 on a lower die unit 204, movable cutting members 207a and 207b start to move upward at angles of 45 deg with respect to the horizontal to cut and, at the same time, clinch the leads 201a and 201b projecting from the under side of the board 202 (see FIG. 7b). The fragments 208 cut off fall off through the unit 204 under gravity.

Whether or not the resistor main body 200 has been properly held in place is then detected through the leads 201a and 201b by electrically insulating the movable cutting members 207a and 207b from the main body of the lower die unit 204 and giving a potential across the movable cutting members 207a and 207b. When the resistor main body 200 has been held in position with the leads 201a and 201b properly passed through the holes in the printed board 202, a current flows from one movable cutting member 207a, through the lead 201a, resistor main body 200, lead 201b and to the other movable cutting member 207b. Thus whether or not the resistor main body 200 has been held in place can be detected by measuring the current between the movable cutting members 207a and 207b.

While the apparatus of FIGS. 7a and 7b is used for resistors, conventional component inserting machines also resort to means similar to the lower die unit for attaching the components to printed boards. The foregoing testing method, nevertheless, is not usable for the components in which even a very weak current is likely to break down the internal circuit of the component.

Accordingly the conventional component inserting machines are adapted to detect the complete insertion of the components by the means illustrated in FIG. 8 and comprising an inserting head main body 209 provided with a vertically slidable inserting rod 210. The inserting rod 210 has one end carrying a component holder 211 and the other end carrying a member 214 for striking the actuator 213 of a microswitch 212.

The component 100 to be installed is attracted to the holder 211 by a vacuum or held to the holder 211 and also by the grooved forward ends 215a of inserting guides 215 for guiding the leads 101a and 101b of the component into holes 1a and 1b of a printed board 1, and is lowered along with the main body 209 to a position immediately above the board 1, whereupon the guides 215 are moved away from each other by an external force to the position shown in FIG. 8 as indicated by arrows h. When the guides 215 have been completely retracted, the inserting rod 210 presses the component 100 against the board 1 with an air cylinder or a spring 216 provided between the main body 209 and the holder 211 for pressing the component with a force i, thus inserting the leads 101a and 101b of the component 100 into the holes 1a and 1b in the board 1. When the leads 101a and 101b of the component 100 are fully inserted into the holes 1a and 1b of the board 1, the striking member 214 also lowers to a full extent to depress the actuator 213 of the microswitch 212, detecting the insertion of the leads 101a and 101b of the component 100 into the holes 1a and 1b. If the leads 101a and 101b of the component 100 fail to pass through the holes 1a and 1b of the board 1, the inserting rod 210 will not lower to the specified position but remains in the position of FIG. 9a without causing the member 214 to strike the actuator 213 for the detection of insertion. This indicates that the leads have not been properly inserted in position.

This method, however, has the drawback of involving difficulty in adjusting the magnitude of the force i with which the component 100 is to be pressed against the printed board 1. The force i, if too great, would bend the lead 101a, for example, without inserting the lead into the hole 1a as seen in FIG. 9b, while permitting the detecting means to function normally. Consequently the fault is not detectable. Conversely if the force i is too small, the leads 101a and 101b, even when in alignment with the holes 1a and 1b, will not be passed through the holes but remain in the same position as shown in FIG. 9a.

With the component inserting machine heretofore available, the detecting means is thus liable to indicate complete insertion even if one or both of the leads 101a and 101b are unable to enter the holes 1a and 1b and remain in the position of FIG. 9b owing to the resistance to the sliding of the inserting rod 210, the resistance to the sliding of the leads 101a and 101b along the grooved ends 215a of the guides 215, the resistance to the insertion of the leads 101a and 101b into the holes 1a and 1b or like cause. Briefly the conventional detecting means is not adapted to detect whether or not the leads 101a and 101b have been properly passed through the printed board 1 but merely indicates whether or not the inserting rod 210 has lowered to a certain position, so that when some leads of the components on the board are improperly installed, the detector is unable to detect the faults. Accordingly when all the components have been completely attached to the board, the leads must be checked with eyes.

The main object of the present invention is to provide an apparatus useful for circuit components which can not be tested for proper installation by passing a current therethrough and which have a large number of leads as arranged in one or more rows for insertion into printed boards, the apparatus being adapted to check the leads one by one reliably to detect whether or not each of the leads has been passed through the board and properly clinched thereto.

According to a preferred embodiment of the invention, the apparatus is serviceable for different kinds of circuit components alike whether the component has ten or sixteen leads or has only eight leads, the apparatus being adapted to insert the leads into the board and clinch the leads to the board and thereafter detect whether or not every lead has been properly inserted in place with reference to an electric signal given before the insertion.

Various other features and advantages of the invention will becom apparent from the following description of a preferred embodiment given with reference to the accompanying drawings, in which:

FIG. 1 is a schematic side elevation showing a lead detecting apparatus embodying the invention;

FIG. 2b is a side elevation of FIG. 2a;

FIG. 3 is an enlarged view showing an upper portion of FIG. 2a;

FIGS. 4a and 4b are diagrams illustrating the lead clinching and detecting operation of the apparatus of FIG. 2a;

Figure 2A:
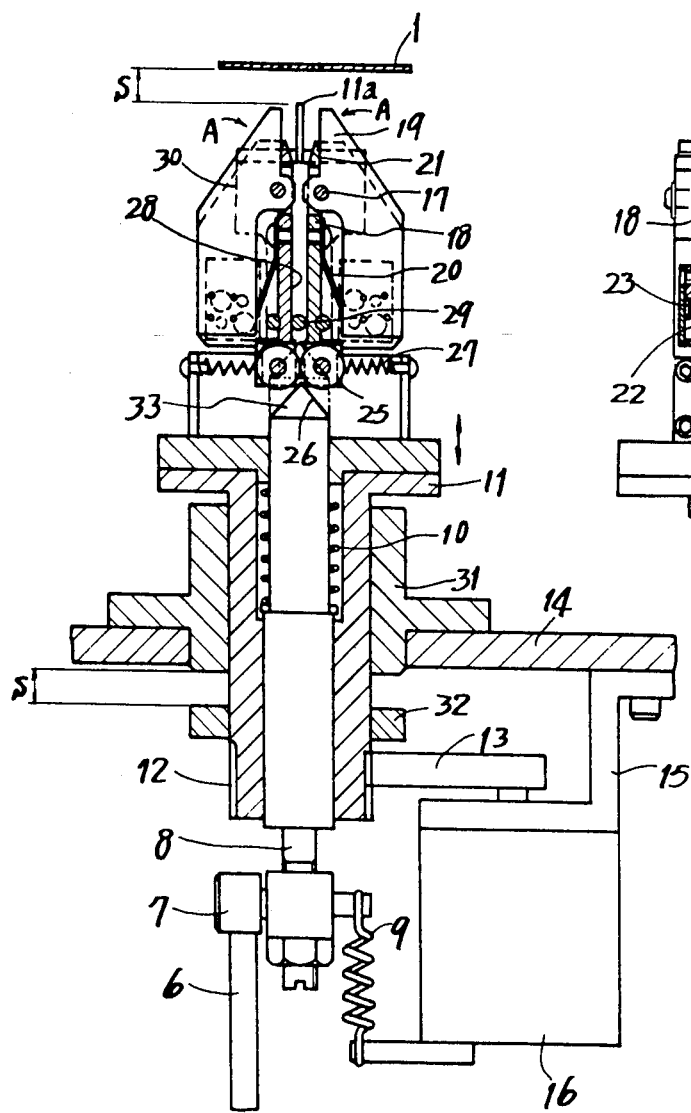
FIG. 2a is a fragmentary view in vertical section showing the apparatus of FIG. 1.
Figure 2B:
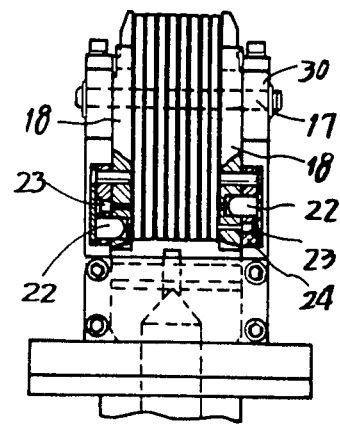

With reference to FIGS. 1 to 6, indicated at 1 is a printed board, under which a lead detecting apparatus 2 is positioned in alignment with a component inserting head 3 along a vertical line Z—Z. The inserting head 3 is driven by a cam 4 which in turn is rotated by a shaft 4a. The torque of the shaft 4a is delivered, through a chain 5 and several tension sprockets 5a, to a shaft 6a carrying a plate cam 6. The plate cam 6, when driven through the above transmitting means, moves a center rod 8 up and down via a cam roller 7 which is rollable on the plate cam 6 under the action of a tension spring 9. The center rod 8 supports an anvil main body 11 with a compression spring 10 provided therebetween. The anvil main body 11 has at its lower end a gear portion 12 meshing with a sector drive gear 13, by which the main body 11 is turnable through a desired angle on a horizontal plane. The drive gear 13 is driven by a cylinder 16 secured to a bracket 15 attached to the base 14 of the apparatus.

A pair of lever main bodies 18 disposed at the upper end of the anvil main body 11 are pivotably supported respectively on a pair of pins 17 attached to flanges 30 of the main body 11. Each of the lever main bodies 18 is provided with a plurality of levers 19 supported on the pin 17. A comb-shaped plate spring 20 attached to the lever main body 18 has teeth, with the free ends of the teeth elastically bearing against the lower ends of the levers 19 respectively, whereby the upper ends of the levers 19 are held in contact with the inner wall 21 of the lever main body 18. Pairs (e.g. two pairs in the illustrated embodiment) of light-emitting elements 22 and light-receiving elements 23 opposed to the elements 22 axially of the pins 17 are attached to the lever main body 18 by holders 24.

Figure 6A:
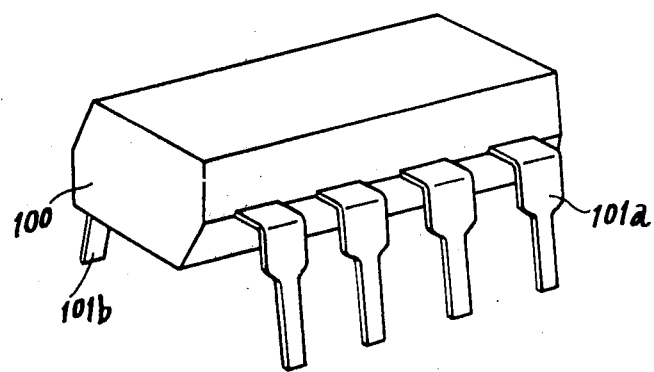
FIGS. 6a, 6b and 6c are a perspective view, a front view and a side elevation respectively of a component to be inserted by the apparatus.
Figure 6B:
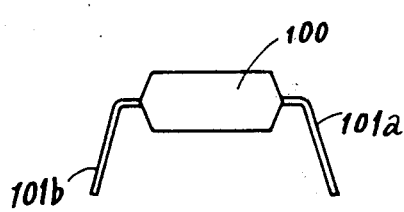
Figure 6C:
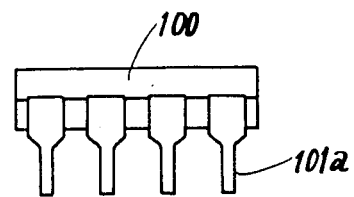
Figure 7A:
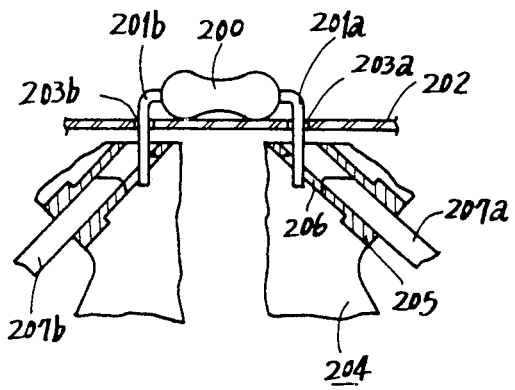
FIGS. 7a and 7b are fragmentary sectional views showing a conventional apparatus for attaching resistors or like parts.
Figure 7B:
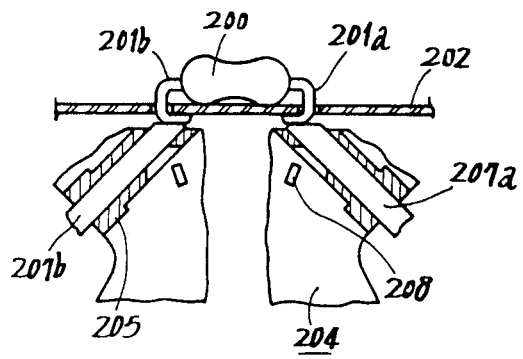
Figure 8:
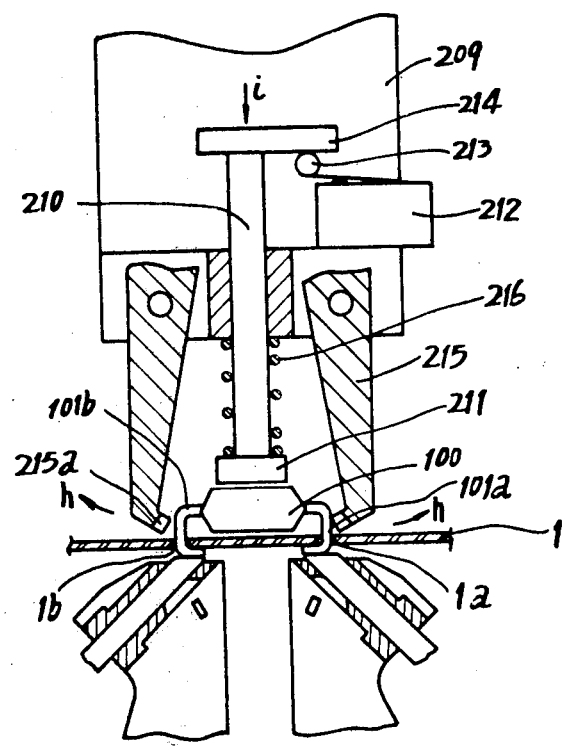
FIG. 8 is a fragmentary sectional view showing a conventional component inserting machine provided with detecting means.
Figure 9A:
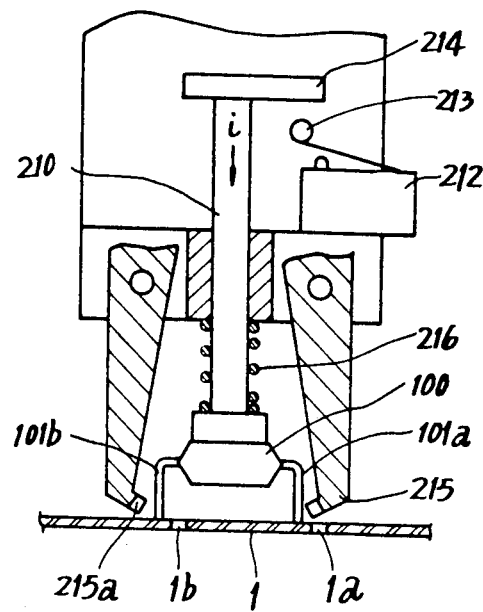
FIGS. 9a and 9b are views illustrating the detecting operation of the machine of FIG. 8.
Figure 9B:
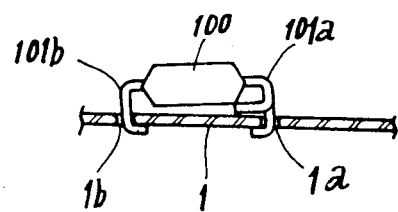

Rollers 25 are supported by pins 26 on the lower portions of the lever main bodies 18. Compression springs 27 provided between the flanges 30 and the lower portions of the lever main bodies 18 bias the lower portions usually toward each other, holding the outer surfaces 28 of the lever main bodies 18 in pressing contact with a pin 29 attached to the anvil main body 11. The anvil main body 11 is vertically slidably supported by a housing 31 attached to the base 14. FIGS. 6a, 6b and 6c show a component 100 having leads 101a and leads 101b projecting downward from its opposite sides as arranged in a row on each side.

The apparatus briefly described above will be further described in greater detail with respect to its operation and construction.

When the rotation of the cam 6 raises the center rod 8, raising the anvil main body 11 through a stroke S, the upper surface of a stopper 32 attached to the anvil main body 11 comes into contact with the bottom face of the housing 31. This prevents the anvil main body 11 from moving further upward. The stroke S is also the distance the uppermost end 11a of the lead detecting apparatus 2 passes through to almost contact the under side of the printed board 1.

With a further upward movement of the center rod 8, a conical portion 33 at its upper end comes into contact with the rollers 25 and moves the rollers 25 away from each other. This movement turns the lever main bodies 18 and the levers 19 about the pins 17 in the directions of arrow A, thereby moving the upper ends of the opposed levers 19 toward each other. Through this movement, the levers 19 clinch the leads 101a and 101b projecting from the under side of the printed board 1 while the apparatus detects whether or not the leads 101a and 101b have been properly passed through the specified holes in the board 1. The lead clinching and detecting operation will be described in greater detail.

With the uppermost end 11a of the lead detecting apparatus 2 almost brought into contact with the under side of the printed board 1 by the rise of the center rod 8, the leads 101a and 101b of the component 100 are inserted into the specified holes 1a and 1b of the board 1 (FIG. 3). The operation will hereinafter be described with respect to the leads 101a only. A further rise of the center rod 8 turns through the roller 25 the upper portion of the lever main body 18 in the direction of the arrow A and also turns the upper portions of the levers 19 in the same direction at the same time. Upon the upper ends of the levers 19 coming into contact with the leads 101a, the levers 19 alone are stopped. With a further turn of the lever main body 18, a stopper 35 on a lower portion of the lever main body 18 comes into contact with lower portions of the levers 19, causing the lever upper ends to clinch the leads 101a inward (FIG. 4a).

While the circuit components to be installed are classified as different kinds according to the number of the leads 101a, each of the levers 19 is formed in its lower portion with detecting apertures identical in number to the number of the kinds of the components, n. Since the present embodiment is adapted for use with two kinds of components 100, the lever 19 is formed with two detecting apertures 36a and 36b. Furthermore the number of the pairs of the light-emitting elements 22 and light-receiving elements 23 attached to the lever main body 18 is equal to the number of the kinds of the components 100, namely to the number of the detecting apertures in the lever 19, and is therefore n. The detecting apertures formed in the levers 19 are so arranged that, with the lower portions of the levers 19 positioned in contact with the stopper 35 on the lever main body 18, the apertures 36a of the levers 19 are in alignment with the optical axis of one pair of the elements 22 and 23, and the apertures 36b of some of the levers 19 are in alignment with the optical axis of the other pair of the elements 22 and 23, the apertures 36b (i.e. 36b') of the other levers 19 being so formed that these levers 19 will not block the optical axis of the above-mentioned other pair at all times irrespective of the position of the levers 19 having the apertures 36b'. The different kinds of the components 100 different in the number of the leads 101a can be tested for insertion by the combination of the detecting apertures 36a, 36b and 36b'.

Figure 5A:
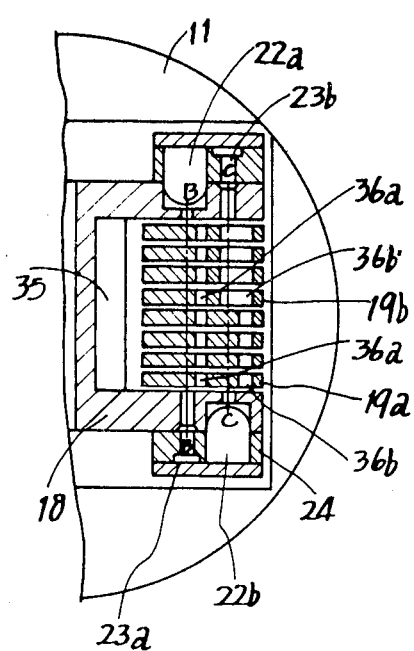
FIGS. 5a and 5b are fragmentary plan views in cross section illustrating the lead clinching and detecting operation.
Figure 5B:
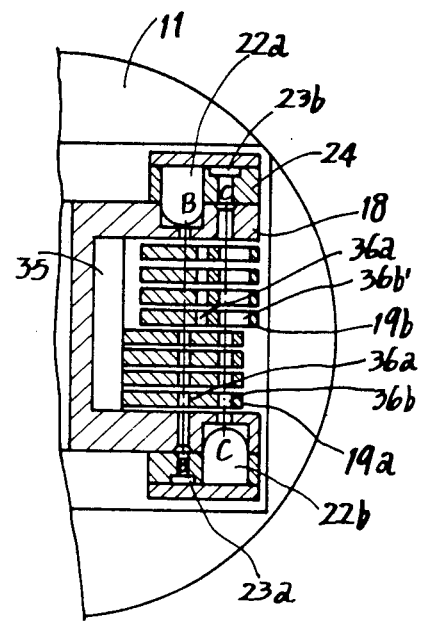

FIGS. 5a and 5b show an arrangement useful for two kinds of components 100, one having eight leads 101a and the other four leads 101a, on one side of the components. With reference to FIG. 5a, the detecting apertures 36a in the levers 19a and 19b are adapted for alignment with the optical axis B—B of light-emitting elements 22a and light-receiving elements 23a for testing the components 100 with eight leads 101a. The detecting apertures 36b in the levers 19a and the detecting apertures 36b' in the levers 19b are adapted for alignment with the optical axis C—C of light-emitting elements 22b and light-receiving elements 23b for testing the components 100 with four leads 101a.

In the case of the component 100 with eight leads 101a, the stopper 35 on the lever main body 19 comes into contact with all the eight levers 19, which in turn clinch the leads 101a passed through the specified holes in the printed board (FIG. 4a). Consequently the detecting apertures 36a of the levers 19a and 19b are aligned with the optical axis B—B. As seen in FIG. 5b, if at least one (four, in the illustration) of the eight leads 101a fails to pass through the board 1, at least one detecting aperture 36a of the eight levers 19 is out of alignment with the optical axis B—B, permitting the lever 19 to block the optical axis B—B.

In the case of the component 100 with four leads 101a, the lever main body 18, when turned with the leads 101a passed through the specified holes in the printed board 1, causes the stopper 35 to come into contact with the four levers 19a corresponding to the leads 101a, bringing the detecting apertures 36b of the levers 19a into alignment with the optical axis C—C. The optical axis C—C extends through the detecting apertures 36b' of the levers 19b at all times (FIGS. 5a and 5b). If at least one of the four leads 101a fails to pass through the printed board 1 (FIG. 4b), at least one detecting aperture 36b of the levers 19a is out of alignment with the optical axis C—C. The corresponding lever 19a therefore blocks the optical axis C—C.

In this way, with use of the levers 19 having the detecting apertures 36a and detecting apertures 36b, 36b' corresponding, in number and position, to the leads 101a of the components 100 to be attached in place, whether or not the leads 101a have been completely inserted into the printed board 1 can be detected depending on whether or not the beam emitted from the light-emitting element 22 to the light-receiving element 23 and corresponding to the apertures concerned remains blocked by the lever 19.

With the detecting apertures 36 of the levers 19 and the light-emitting and -receiving elements 22 and 23 provided in combination in corresponding relation to the number of the kinds of the components 100, the different kinds of components with different numbers of leads 101a can be tested for proper attachment by a single lead detecting apparatus 2.

With reference to FIGS. 4a, 4b, 5a and 5b, the operation and construction of the apparatus have been described only for the leads 101a on one side of the component 100 since the leads 101b on the other are symmetrical with the leads 101a.

According to the invention described above, several kinds of circuit components different in the number of leads can be tested by a single detecting apparatus as to whether or not all the leads have been properly inserted into the printed board, while the leads inserted can be clinched to the board against falling off. The photoelectric detecting means, which involves no contact, has the advantage that the components can be tested free from the electrical influence conventionally experienced with electric detecting means.

What is claimed is:

1. An apparatus for detecting leads comprising:
   a pair of lever main bodies movable toward or away from each other, each at least at its one end,
   a plurality of levers corresponding to the leads and pivotably supported on each of the main bodies by a pin intersecting the plane of movement of the end of the lever main body,
   an elastic member provided between each of the lever main bodies and the levers mounted thereon and biasing one end of each of the levers toward one end of the corresponding lever on the other lever main body to bring the lever into contact with a first stopper, the elastic member being elastically deflectable by a force smaller than the force required to clinch the lead,
   a second stopper for restraining each of the levers from turning relative to the lever main body more than a specified amount in a direction opposite to the direction in which the lever is biased by the elastic member, and
   a detector including photoelectric means mounted on the lever main body for detecting whether or not the lever is in contact with the second stopper.

2. An apparatus as defined in claim 1 wherein the photoelectric means are provided in pairs in corresponding relation to a plurality of kinds of electronic components different in the number of the leads, the levers being divided into a group corresponding to each pair of the photoelectric means and another group, the levers having a plurality of apertures corresponding to the groups so that the lever of the group corresponding to each pair of the photoelectric means, when positioned in contact with the second stopper, permit the light of the photoelectric means of the pair to pass therethrough while allowing the levers of the other group to position in contact with the first stopper and pass the light therethrough.

3. An apparatus as defined in claim 1 wherein each of the lever main bodies is turnably supported on corresponding one of a pair of parallel rods, and the pin is parallel to the rod.

4. An apparatus as defined in claim 1 wherein the rod and the pin comprises the same member.

5. An apparatus as defined in claim 3 or 4 further comprising a vertically movable rod having at its one end a tapered portion engageable with the other end of each of the lever main bodies.

6. An apparatus as defined in claim 5 wherein the lever main body is provided at the other end thereof with a roller engageable with the tapered portion.

* * * * *